United States Patent [19]

Barresi et al.

[11] Patent Number: 4,489,923
[45] Date of Patent: Dec. 25, 1984

[54] FIXTURE FOR SOLDER TINNING CHIP CARRIERS

[75] Inventors: Anthony J. Barresi, Hammonton; Leonard Nelson, Cherry Hill; Jack Pogson, Toms River, all of N.J.

[73] Assignee: RCA Corporation, New York, N.Y.

[21] Appl. No.: 520,820

[22] Filed: Aug. 5, 1983

[51] Int. Cl.³ .............................................. B25B 11/00
[52] U.S. Cl. ........................................ 269/8; 269/903; 228/57; 428/137; 428/900
[58] Field of Search .................. 204/297 W; 428/137, 428/692, 900; 269/8, 903; 228/57; 198/690; 209/904

[56] References Cited

U.S. PATENT DOCUMENTS

| | | | |
|---|---|---|---|
| 3,605,999 | 7/1969 | Coon | 206/328 |
| 3,783,499 | 1/1974 | Hughes | 29/574 |
| 4,071,944 | 2/1978 | Chuss | 29/574 |

OTHER PUBLICATIONS

Edmund Scientific Catalog, p. 19, Summer 1982 Catalog Super Magnetic Plate, Cat. No. R31,591, "High Density Low Cost Microelectronics Packaging Proposal" Moorestown, NJ, Prop. No. 6E0096A, Mar. 1978.

Primary Examiner—George F. Lesmes
Assistant Examiner—William M. Atkinson
Attorney, Agent, or Firm—Joseph S. Tripoli; Robert L. Troike; Robert Ochis

[57] ABSTRACT

Leadless chip carriers (LCCs) are pretinned using wave soldering equipment. A magnetic fixture having a coating of material which is non-solderable provides a plurality of LCC retention locations. The LCC retention locations are configured to ensure free solder-wave access to all edges of the chip carriers disposed thereon and to substantially prevent the dislodging of the chip carriers by the forces of the solder wave.

8 Claims, 5 Drawing Figures

FIXTURE FOR SOLDER TINNING CHIP CARRIERS

This invention relates to the field of chip carriers for semiconductor integrated circuits and more particularly to solder tinning the contacts of chip carriers.

Many semiconductor integrated circuits are now packaged in hermetic chip carriers (HCCs). HCCs which have surface electrical contacts rather than protruding electrical leads are known as leadless chip carriers (LCCs). LCCs generally have square or rectangular outlines. As manufactured, the contacts on chip carriers are generally plated with gold or other protective metals. Direct soldering of such chip carriers to printed circuit boards without pretinning the leads can produce poor quality solder joints which result in early failure of the solder bonds.

It is known to tin the surface contacts of LCCs by placing the chip carriers on the "tread" portion of a Teflon wheel in a contacts-outward orientation. The chip carriers are held on the wheel magnetically by magnets within the wheel which attract the Kovar or other magnetic material covers which seal the cavity of the leadless chip carrier. The surface contacts are fluxed and the wheel with the fluxed chip carriers on it is mounted over a pot of molten solder. The wheel is rotated to bring the contacts of each chip carrier into contact with the solder to effect the contact tinning process. This technique has a number of disadvantages for production use. First, wheels having a diameter of approximately six inches and capable of holding nineteen chip carriers at a time provide a maximum throughput of about 1000 LCCs per hour/per solder pot. Second, the relatively small curvature of such a wheel over a region in the vicinity of each LCC results in a shallow entry and withdrawal angle of the chip carriers into the solder when the LCCs do not totally submerge in the solder. This shallow angle of withdrawal from the solder pot tends to retain excess solder on the chip carriers and can cause the formation of solder bridges between the contacts of the chip carriers.

In tinning the contacts of a chip carrier, it is important that the magnetic material cover of the chip carrier not be tinned. Legends are printed on these covers which identify the circuit contained in the chip carrier and any other pertinent information such as manufacturing date, lot number and so forth. If these covers become tinned with solder, the legends become undecipherable and the chip carriers are then unusable in any system in which traceability of parts is required.

A system is needed for tinning the contacts of leadless chip carriers in a high throughput manner which avoids the problems of solder bridges, the retention of excess solder and the tinning of the covers.

The present invention provides such a system through use of a magnetic plate having a surface to which the solder will not adhere and having chip-carrier-retention locations with a physical configuration (such as a depression) which prevents the dislodgement of chip carriers during the tinning. For tinning, the chip carrying plate is mounted in a chip-carriers-downward orientation for transport through a wave soldering machine in a manner to cause the solder wave to contact and tin all of the contacts of the leadless chip carriers. The physical configuration of the chip carrier retention locations must be one which ensures that the solder of the wave has free access to the sides of the chip carrier in order to achieve tinning without creating solder bridges or bumps.

BRIEF DESCRIPTION OF THE DRAWINGS

FIG. 1 is a perspective view of a fixture 10 in accordance with the present invention for holding leadless chip carriers (LCCs) 50 for tinning in a wave soldering system. Fixture 10 has an upper (in FIG. 1) surface 15 having a plurality of chip carrier retention locations thereon in the form of depressions 22 in the otherwise planar surface 15. In FIG. 1 some of the chip carrier retention locations 22 are occupied by LCCs 50 which are disposed in a contacts-upward orientation. These LCCs have a major surface 52 and lateral edges 54. Each of the LCC's contacts 56 is disposed partially on major surface 52 and partially on one of the lateral edges 54.

Figures 1, 2:
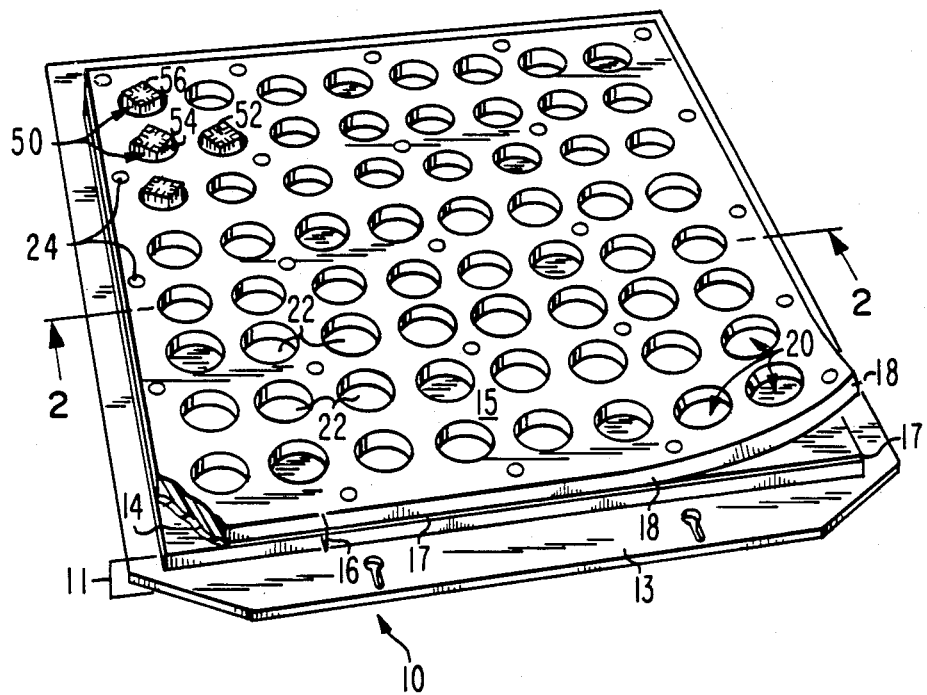
FIG. 1 is a perspective view of apparatus in accordance with the present invention.
FIG. 2 is a cross-section through the view of FIG. 1 taken along the line 2—2.

Fixture 10 comprises a plate member 11 having a major, substantially planar, surface 14 on which a coating 16 of solder repellant material is disposed. The surface 15 of the fixture is the upper surface of coating 16. Plate member 11 provides a magnetic field which is capable of retaining LCCs on the plate when the plate is in an LCCs downward orientation. Plate member 11 may preferably be a "Super Magnetic Plate" which is available from the Edmund Scientific Co. This member measures 9¼ inches by 10¼ inches by 0.325 inch thick and has its exterior surface galvanized. The source of the magnetic field in plate 11 is permanent magnets in the form of strips 26 of magnet material located between its front and back plates 12 and 13 as is seen in the cross-sectional view in FIG. 2. These magnet strips are preferably arranged parallel to each other.

The solder used for tinning the chip carriers would adhere to the galvanized surface 14, if it were contacted by the solder. The solder repellant (solder non-adherent) coating 16 prevents the accumulation of solder on the fixture. The solder repellant coating 16 is preferably comprised of two layers 17 and 18, but could be a single layer. Layers 17 and 18 are preferably self-supporting layers of fiberglass, but may be other solder repellant materials which are stable at soldering temperatures. Layers 17 and 18 are secured to member 11 in an appropriate manner such as by screws 24. Other securing techniques may be utilized.

Layer 17 is preferably a continuous layer of substantially uniform thickness and is disposed in contact with the surface 14 of plate 12. Layer 18 is disposed in direct contact with layer 17. In the lower right corner of FIG. 1 layer 18 is "peeled-away" to show its structure. Layer 18 has a plurality of preferably circular apertures 20 therein. These apertures have edges which are perpendicular to the surface 14. Each of the apertures 20 defines one of the chip-carrier-retention depressions 22 in the exposed surface 15 of the fixture 10. Layer 17 preferably has a thickness of about 0.008 inch, but may be thicker or thinner. Layer 18 preferably has a thickness of about 0.030 inch for chip carriers which are about 0.080 inch thick but layer 18 may be thicker or thinner. It is preferable for the depth of the depressions 22 (the thickness of layer 18) to be less than the thickness of the chip carriers so that the contacts of chip carriers mounted in the retention locations project beyond the non-depressed portion of the upper surface 15 of fixture 10.

The chip carrier retention locations 22 are preferably arranged in parallel rows. Each of the chip carrier retention locations (depressions) is preferably circular with a diameter of up to 11/16 inch. An 11/16 inch diameter depression accommodates chip carriers as large as ½ inch by ½ inch. Sixty-four 11/16 inch diameter retention locations (depressions) fit easily on the Super Magnetic Plate in an eight rows by eight columns configuration. Each row of depressions 22 preferably overlies one of the magnet strips 26.

To tin a batch of leadless chip carriers, they are placed on the fixture 10 in a contacts-up configuration with one chip carrier in each retention location. Once all of the chip carriers to be treated at one time are mounted on the fixture 10, they are fluxed. The fixture is then mounted in a suitable rack for transport through the wave of a wave soldering machine in a chip-carriers-down orientation. The fluxing can be done by the wave soldering machine or before the fixture is mounted on the machine. The wave solder system is set so that the solder wave touches all contacts and leaves them tinned with solder.

Once the fixture 10 emerges from the solder wave, it is removed from the wave soldering machine and placed in a chip-carrier-up orientation. The chip carriers may be removed from fixture 10 in any appropriate manner such as by tweezers.

Substantial force is exerted on the chip carriers as they pass through the solder wave. When layer 18 (or layers 18 and 17) is omitted so that fixture 10 has a smooth surface 15 which is free of physical chip-carrier-retention means, this force can push the LCCs along the surface of the fixture and dislodges some of them from fixture 10. The dislodged LCCs fall into the solder. Some of the LCCs which are not dislodged are pushed into contact with each other. This leads to poor tinning and the formation of solder bumps and bridges. Layer 18 is thick enough to serve as a curb around each chip-carrier-retention location. This curb prevents the chip carriers from being pushed into each other or off fixture 10 by the wave forces.

The solder wave's nature and shape assure a sharp contact angle between the solder wave and the chip carriers and aids in the prevention of solder bridges and other excessive accumulations of solder being retained on the leadless chip carriers as they emerge from the solder.

With the fixture described above with sixty-four chip-carrier-retention locations, a throughput of 10,000 LCCs per hour is possible per wave soldering machine. If a greater throughput is desired, throughput can be increased to about 15,000 per hour by use of a fixture measuring 15 inches by 16 inches and holding 144 LCCs.

The fixture and method of tinning the contacts on leadless chip carriers has a number of advantages over the prior art Teflon wheel system. First, the chip-carrier-retention locations ensure that the chip carriers will not be dislodged from the fixture during the tinning process. Second, the retention of excessive solder and solder bridges on the tinned leadless chip carriers is eliminated. Third, the placement and removal of the chip carriers on fixture 10 may be automated through use of vacuum pickup and placement or other automated techniques.

Figure 3:
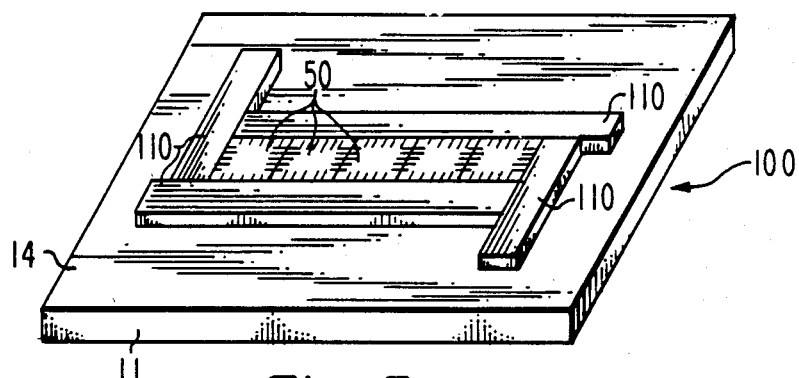
FIG. 3 is a perspective view of one manner of physically retaining chip carriers on a fixture.

During the development of fixture 10, an initial attempt to restrain the movement of the chip carriers 50 in response to the solder wave forces involved the placement of strips 110 of magnetic material in a configuration to retain the chip carriers 50. This configuration is illustrated on fixture 100 in FIG. 3. This was found ineffective for several reasons. First, the chip carriers 50 which were not over magnetic strips 26 within member 11 tended to be dislodged. Second, there were many solder bridges and bumps on the chip carriers when tinning was completed.

Galvanized steel is generally considered nonsolderable. Thus, initially no additional layer was used over the galvanized surface of member 11. However, it was found that solder adhered to and accumulated on the surface 14.

Figure 4:
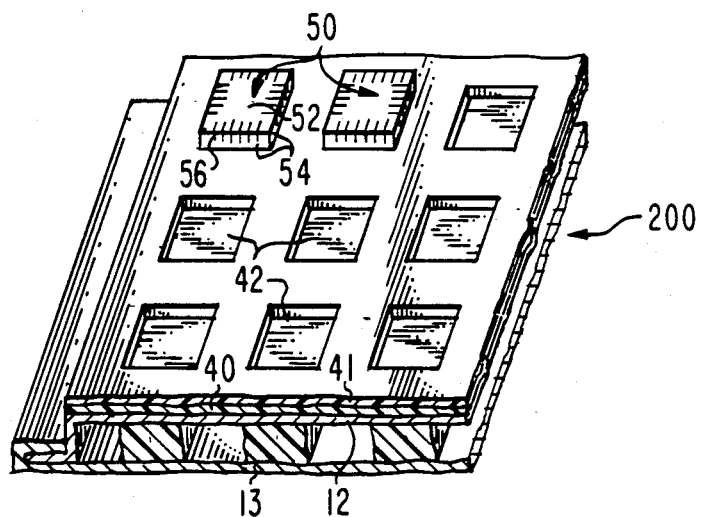
FIG. 4 is a perspective view of another manner of physically retaining chip carriers on a fixture.

A subsequent attempt to retain the chip carriers 50 in position and to achieve good tinning involved the use of rectangular depressions 42 to retain the chip carriers. These rectangular depressions were sized to be a close fit for the chip carriers 50. A fixture 200 of this type is illustrated in FIG. 4. The apertures 42 were made in a layer 41 of fiber glass material of the type used in the fabrication of multi-layer circuit boards. A layer 40 of GE 157 RTV (Room Temperature Vulcanizable rubber) intervened between the fiber glass 41 and the surface 14 of the plate 11. This RTV did not hold up during soldering. Dow Corning 3145 RTV was substituted. The RTV layer provided a solder non-adherent layer and served as an adhesive for securing the fiber glass layer to member 11. This fixture provided poor quality tinning—some contacts were not properly tinned and others had solder bumps and bridges. After a number of test runs, the RTV layer 40 bubbled and ruptured with the result that solder got behind the chip carriers and coated the magnetic covers of the LCCs.

The poor tinning with square depressions appears to result from restricted contact between the solder wave and the chip carrier. Apparently the close proximity of the edge of the aperture 42 to the edges 54 of the chip carrier 50 provides a buffering action which prevents the solder wave from properly scrubbing the contacts of the chip carrier. This prevents proper tinning and causes solder bumps and solder bridges as well as untinned spots on some contacts. Square, close fitting depressions can also make removal of the tinned chip carriers difficult.

The circular depressions 22 of fixture 10 were substituted for the square depressions of fixture 200 and the layer 17 of fiber glass was substituted for the RTV layer. High quality tinning resulted from the use of this fixture 10. The circular depressions 22 of fixture 10 ensure free access of the solder wave to the edges 54 of the chip carrier. Thus, it appears to be desirable to make the cross-sectional configuration (outline) of the chip-carrier-retention locations different from the cross-sectional configuration (outline) of the chip carriers. This helps to ensure that the solder wave will have free access to all edges of the chip carrier. Such free access enables the solder wave to scrub the contacts and tin them thoroughly while avoiding the formation of solder bridges. It is for this reason that the use of round apertures 20 to create the chip carrier retention depressions 22 is preferred. The periphery of such retention locations is touched at a maximum of two points by a square-type leadless chip carrier which has a diagonal dimension which is less than the diameter of the circle. This ensures that all four edges of the chip carrier are accessible to the solder wave.

Figure 5:
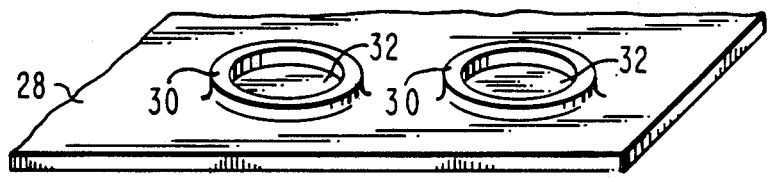
FIG. 5 is a perspective view of an alternative configuration for one component of the FIG. 1 apparatus.

As an alternative to the depressions 22 as chip-carrier-retention mechanisms, a single molded or formed layer 28 of a material to which solder does not adhere may be utilized with chip-carrier-retention locations in the form of molded-in or formed-in protruding ridges 30 such as those illustrated in FIG. 5. The ridges 30 preferably have substantially vertical or slightly overhung inner faces disposed toward the chip-carrier-retention sites 32 which they define. The inner faces of ridges 30 are effective as curb surfaces for preventing the chip carriers from moving along the surface 15 of the fixture 10 and ensure solder wave access to the edges of the LCCs contained therein.

The fixture 10 can also be used with hermetic chip carriers which have protruding leads rather than surface contacts so long as the solder wave forces on those leads do not dislodge the carriers.

What is claimed is:

1. A fixture for supporting chip carriers for solder tinning, comprising:
    a member having a substantially planar major surface to which solder will not adhere, said member including magnetic means for magnetically retaining chip carriers on said member while said member is in a chip-carrier-downward orientation;
    said major surface having a plurality of spaced apart, physically defined chip-carrier-retention locations thereon, each adapted for retaining a single chip carriers and for spacing said single chip carrier from other chip carriers;
    said member being suitable for transport across the solder wave of a wave soldering system in a chip-carrier-downward orientation with any chip carriers disposed thereon in a tinning relationship to said wave;
    each of said chip-carrier-retention locations having a curb surface configured to contact the periphery of said single chip carrier at most at spaced points for restricting lateral movement of said chip carrier therein, for preventing contact between chip carriers and for allowing solder wave access to all edges of the chip carrier in a manner effective for tinning all contacts thereon.

2. The fixture recited in claim 1 wherein:
    said member comprises a plate having a major surface to which solder will adhere; and
    a covering material to which solder will not adhere disposed over said solder-adherent major surface of said plate.

3. The fixture recited in claim 2 wherein said solder non-adherent covering material includes:
    a substantially planar major surface disposed toward said plate; and
    an opposing major surface including a plurality of protruding ridges each of which surrounds one of said chip-carrier retention locations and has an inner face which comprises said curb surface of that chip-carrier-retention location.

4. The fixture recited in claim 2 wherein:
    said solder non-adherent covering material includes first and second adjacent, solder non-adherent, layers;
    said first layer substantially covering said major surface of said member and having a substantially uniform thickness;
    said second layer having a plurality of apertures therein each of which comprises said curb surface of one of said chip carrier retention locations which is in the form of a depression in said solder non-adherent major surface of said member.

5. The fixture recited in claim 4 wherein:
    each of said apertures has a peripheral contour in the form of an edge disposed substantially perpendicular to said major surface.

6. The fixture recited in claim 4 wherein:
    each of said apertures has a periphery which is a closed curve.

7. The fixture recited in claim 6 wherein:
    said curve is a circle.

8. A fixture for supporting rectangular chip carriers for solder tinning in wave soldering equipment comprising:
    a magnetic support plate having a major surface and being suitable for mounting in a wave soldering transport rack;
    a layer of material to which the solder to be used is non-adherent, said layer being disposed on said major surface of said plate; and
    a plurality of chip carrier retention depressions in said major surface of said solder non-adherent material, said depressions each having a depth and peripheral contour configured to limit contact between the periphery of said depression and the periphery of said rectangular chip carriers to the corners of the chip carrier and to limit lateral movement of said chip carrier mounted therein, to prevent that chip carrier from being dislodged by the force exerted on it by the solder wave as it passes across the solder wave and to allow effective tinning contact between said solder wave and the contacts of said chip carrier.

* * * * *